(12) United States Patent
Sohn et al.

(10) Patent No.: US 7,825,015 B2
(45) Date of Patent: Nov. 2, 2010

(54) METHOD FOR IMPLANTING IONS IN SEMICONDUCTOR DEVICE

(75) Inventors: Yong-Sun Sohn, Ichon-shi (KR);
Seung-Woo Jin, Ichon-shi (KR);
Min-Yong Lee, Ichon-shi (KR);
Kyoung-Bong Rouh, Ichon-shi (KR)

(73) Assignee: Hynix Semiconductor, Inc., Ichon-si, Kyoungki-do (KR)

( * ) Notice: Subject to any disclaimer, the term of this patent is extended or adjusted under 35 U.S.C. 154(b) by 276 days.

(21) Appl. No.: 11/026,294

(22) Filed: Dec. 30, 2004

(65) Prior Publication Data

US 2005/0250299 A1      Nov. 10, 2005

(30) Foreign Application Priority Data

May 10, 2004   (KR) ................. 10-2004-0032799
Sep. 30, 2004  (KR) ................. 10-2004-0077964

(51) Int. Cl.
*H01L 21/425* (2006.01)

(52) U.S. Cl. .................. 438/514; 257/E21.057; 257/E21.473; 250/492.2; 250/492.21; 250/492.23

(58) Field of Classification Search ............ 438/197, 438/217, 301–308, 514, 527; 257/288, E21.059, 257/E21.443, E21.057, E21.473; 250/492.2, 250/492.21, 492.23
See application file for complete search history.

(56) References Cited

U.S. PATENT DOCUMENTS

| 5,308,780 | A |  | 5/1994  | Chou et al. |
| 5,770,502 | A |  | 6/1998  | Lee |
| 5,843,825 | A |  | 12/1998 | Hwang |
| 6,573,517 | B1 | * | 6/2003 | Sugitani et al. ........ 250/492.21 |
| 6,573,518 | B1 | * | 6/2003 | Renau et al. ........... 250/492.21 |
| 6,750,462 | B2 |  | 6/2004 | Iwasawa et al. |
| 6,930,316 | B2 | * | 8/2005 | Nishihashi et al. ..... 250/492.21 |
| 7,049,210 | B2 | * | 5/2006 | Murrell et al. ............. 438/535 |
| 7,375,354 | B2 | * | 5/2008 | Iwasawa et al. ........ 250/492.21 |
| 2002/0003215 | A1 | * | 1/2002 | Berrian .................... 250/492.3 |
| 2005/0184254 | A1 | * | 8/2005 | Matsumoto et al. ..... 250/492.21 |

FOREIGN PATENT DOCUMENTS

CN          1146628 A          4/1997

(Continued)

OTHER PUBLICATIONS

JP Pub. 08-315765, Nobe Takeshi, "Electrostatic Scan Type Ion Implantation Method", (Nov. 29, 1996) (Machine English Translation).*

(Continued)

*Primary Examiner*—Khiem D Nguyen
(74) *Attorney, Agent, or Firm*—Townsend and Townsend and Crew LLP

(57) ABSTRACT

The present invention provides a method for implanting ions in a semiconductor device capable of compensating for a difference in threshold voltages between a central portion and edge portions of a substrate generated while performing uniform ion implantation to entire surfaces of a substrate and another method for fabricating a semiconductor device capable of improving distribution of transistor parameters inside a substrate by forming a nonuniform channel doping layer or by forming a nonuniform junction profile.

9 Claims, 6 Drawing Sheets

FOREIGN PATENT DOCUMENTS

| | | |
|---|---|---|
| CN | 1383195 A | 12/2002 |
| CN | 1414606 A | 4/2003 |
| EP | 0874389 A1 | 10/1998 |
| JP | 58056416 A | 4/1983 |
| JP | 2001-123474 A | 5/1989 |
| JP | 2006-168696 A | 6/1994 |
| JP | 2007-193018 A | 7/1995 |
| JP | 08-315765 | 11/1996 |
| JP | 2000-150407 | 5/2000 |
| JP | 2003-086530 A | 3/2003 |
| JP | 2003-132835 A | 5/2003 |
| JP | 2003-332254 A | 11/2003 |
| JP | 2005-235682 A | 9/2005 |
| JP | 2006-503434 A | 1/2006 |
| KR | 1995-30218 | 11/1995 |
| KR | 10-0166806 B1 | 9/1998 |
| KR | 10-20010082784 A | 8/2001 |
| KR | 2001-0084282 | 9/2001 |
| KR | 1020010084282 A | 9/2001 |
| KR | 10-20030012855 A | 2/2003 |

OTHER PUBLICATIONS

KR2001-0082784, Sang-Geun Oh "Ion implant device for manufacturing semiconductor", Aug. 31, 2001, Machine English Translation.*

KR0166806, Chang-Hyeon Kim "Impurity Injection Method", Jun. 29, 1997, Machine English Translation.*

KR2003-0012855, Berrian, Donald, W. "Uniform Charged Particle Exposure Device and Method Using Translatable Stage and Faraday Cup", Feb. 12, 2003, Machine English Translation.*

Yoshinori Okumura, et al. "*Source-to Drain Nonuniformly Doped Channel(NUDE) MOSFET Structures for High Current Drivability and Threshold Voltage Controllability*" IEEE Transactions on Electron Devices, vol. 39, No. 11, Nov. 1992.

State Intellectual Property Office , The First Office Action, Application No. 200410081799.8, Apr. 20, 2007.

State Intellectual Property Office of People's Republic of China, The Second Office Action for Chinese Patent Application No. CN200410081799.8, Dated Jan. 16, 2009.

* cited by examiner

METHOD FOR IMPLANTING IONS IN SEMICONDUCTOR DEVICE

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

1. Field of the Invention

The present invention relates in general to method and apparatus for fabricating semiconductor devices, and in particular to method and apparatus for implanting ions in a semiconductor device.

2. Description of Related Arts

The continuing trend in shrinking geometries and increasing monolithic integration and density of semiconductor devices has required more precise control of the process of implanting impurities. Moreover, improvements in semiconductor manufacturing tools used in production and processing of these devices are required in view of mass production technology. This applies to ion implantation methods that are commonly employed in the processing of semiconductor devices. Ion implantation involves ionizing impurities and scanning the impurities in a predetermined region on a substrate to implant a predetermined amount of impurities in a desirable region.

The ion-implantation method makes it possible to selectively implant impurities and to implant impurities having a high purity. The ion-implantation method also allows precise control of impurities, thereby providing excellent reproducibility and uniformity. The method is essential to control doses of implanted impurities, which is accomplished by measuring the ion beam current.

In fabricating a semiconductor device, distribution across the semiconductor wafer of the critical dimension (CD) of a transistor gate is directly related to yields of products. Accordingly, a control of the distribution of the CD is very important in semiconductor device manufacturing, and great efforts are made to control the distribution of the gate's CD through a mask process, an etching process and a sidewall spacer depositing process.

However, it is difficult to control variation in transistor parameters according to locations of a substrate by distribution of the gate's CD and a process for forming spacers on sidewalls of the gate. When using a substrate with a diameter greater than 300 mm, variation in the transistor parameters becomes a severe problem as the semiconductor device becomes increasingly smaller. That is, the gate hard mask and the gate pattern etching process do not have a fixed size according to the location of the substrate. Accordingly, the sizes of the gates become different, thereby generating a difference in the transistor parameters due to different lengths of the gate.

Accordingly, to control the gate's CD distribution, a new method for a photo-exposure process to a central portion and edge portions of the substrate has been developed. Also, there is an effort to perform a new process and develop equipment for improving the distribution within the substrate during the process for forming the spacers on the sidewalls of the gate and the process for patterning the gate using the etching process.

However, no method has been found for improving the distribution of the substrate and semiconductor devices are now developed without controlling the difference of the transistor parameters according to the locations of the substrate.

Furthermore, process margins are much more reduced due to a continuous size reduction of semiconductor devices, thereby inducing a problem of causing more reduction in the yields of the products created by the distribution of the gate's CD.

That is, in case of a minimum size of the gate's CD is 200 nm, the product yields are not much reduced even though the distribution of the gate's CD is ±10%. However, when the minimum size of the gate's CD is 100 nm and the distribution of the gate's CD is ±10%, a decrease in the product yields becomes a serious problem. Accordingly, the distribution should be controlled in a range within approximately ±5%.

However, the process margin due to the continuous size reduction of semiconductor devices greatly decreases, thereby making it difficult to increase the yields of the products because of the difficulty in control of the distribution and a decrease in throughput.

FIG. 1 is a diagram briefly illustrating a conventional ion-implantation apparatus.

Referring to FIG. 1, a conventional ion implanter performs the ion-implantation on the entire surface of a substrate 11 by scanning an ion beam 13 back and forth in a direction of X denoted with $\bigotimes\bigodot$, i.e., in a horizontal direction, due to either electric fields or magnetic fields, and by scanning substrate 11 fixed in a holder 12 back and forth in a Y direction, i.e., in a vertical direction substantially perpendicular to the X direction. Herein, ion beam 13 is irradiated by substrate 11 fixed in holder 12 and then, ion implantation is accordingly performed on substrate 11. At this time, substrate 11 is scanned back and forth in the Y direction by a driving axis 15 connected to a driving device 14.

As explained above, the conventional ion implanter can perform a uniform ion implantation to the entire surfaces of the substrate 11 by scanning the ion beam 13 back and forth in the X direction and by scanning the substrate 11 back and forth in the Y direction. That is, for the uniform ion implantation, scanning speeds in the X and Y directions are identically applied.

However, the uniform ion implantation explained above uniformly implants the ion within the substrate and from the substrate to the substrate without any relation to the distribution of the gate's CD, thereby generating a big difference in an electrical property even within the substrate according to the distribution of the gate's CD.

That is, the electrical property tends to be different according to locations of the semiconductor device on the substrate. For instance, even though a degree of uniformity of the ion-implantation is very high, semiconductor device parameters in the edge portions of the substrate tend to be different from the central portion of the substrate. Therefore, the electrical property of a threshold voltage of a transistor in the semiconductor device parameters are different between the central portion of the substrate and the edge portions of the substrate.

BRIEF SUMMARY OF THE INVENTION

It is, therefore, an object of the present invention to provide a method for implanting ions in a semiconductor device capable of compensating for a difference in threshold voltages between the central portion and edge portions of a substrate generated during performing a uniform ion implantation procedure over the entire surface of a substrate.

It is another object of the present invention to provide a method for fabricating a semiconductor device capable of improving distribution of transistor parameters inside of substrate by forming a nonuniform junction profile.

In accordance with one aspect of the present invention, there is provided a method for implanting ions with locally different doses into a substrate by nonuniform ion implantation.

In accordance with another aspect of the present invention, there is a method for implanting ions with locally different doses into a semiconductive substrate by nonuniform ion implantation for the purpose of reducing the variation of the device characteristics of a semiconductive device.

In accordance with still another aspect of the present invention, there is a method for implanting ions on channel regions of MOSFETs with locally different doses into a semiconductive substrate by nonuniform ion implantation for the purpose of reducing the fluctuation of device characteristics including the threshold voltage of a semiconductive MOSFET device.

In accordance with still another aspect of the present invention, there is a method for implanting ions on source/drain regions of MOSFETs with locally different doses into a semiconductive substrate by nonuniform ion implantation for the purpose of reducing the variation of device characteristics including a threshold voltage of a semiconductive MOSFET device.

In accordance with a further aspect of the present invention, there is a method for implanting ions on one of the lightly doped drain regions and a source drain extension region of MOSFETs with locally different doses into a semiconductive substrate by nonuniform ion implantation for the purpose of reducing the variation of device characteristics in a semiconductive MOSFET.

In accordance with a further aspect of the present invention, there is provided a method for implanting ions into a substrate in an X direction and in a Y direction substantially perpendicular to the X direction, including the steps of: nonuniformly implanting a dose of implanted ions in the central and edge portions of the substrate, differentiating one of a scanning speed in the X direction and a scanning speed in the Y direction in the central portion and the edge portions.

In accordance with a still further aspect of the present invention, there is provided a method for fabricating a semiconductor device, including the steps of: implanting ions into a substrate to form a source/drain junction of a transistor in a predetermined region of a substrate; and additionally implanting ions in a portion of the source/drain junction to compensate a difference in transistor parameters according to locations of the substrate.

BRIEF DESCRIPTION OF THE DRAWINGS

The above and other objects and features of the present invention are better understood with respect to the following description of the preferred embodiments in conjunction with the accompanying drawings, in which.

DETAILED DESCRIPTION OF THE INVENTION

Figure 1:
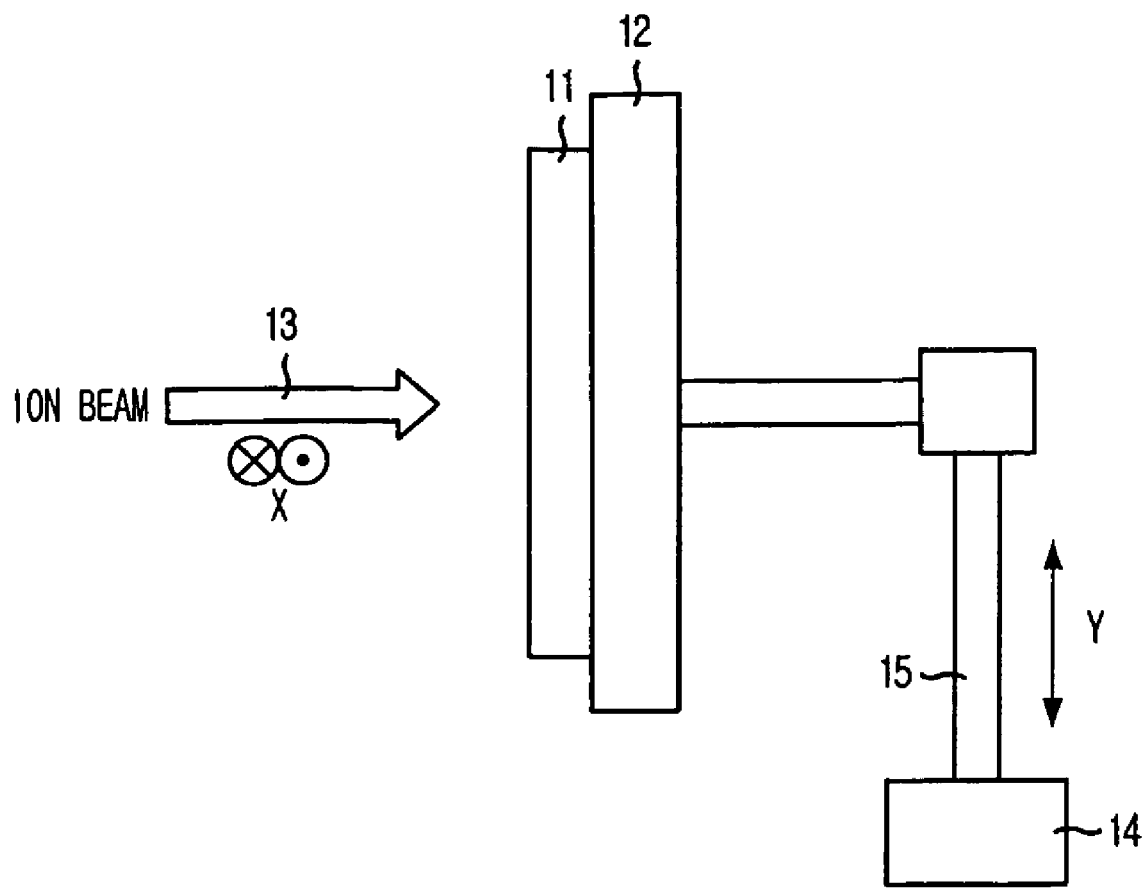
FIG. 1 is a diagram briefly illustrating a conventional ion-implantation apparatus.

A method for implanting ions in a semiconductor device in accordance with a first embodiment of the present invention is described below in detail with reference to the accompanying drawings.

In accordance with this aspect of the present invention, reciprocation scanning speeds in X and Y directions are differently set according to locations of a substrate for a nonuniform ion implantation method.

The present invention is invented based on a technical principle to recognize a difference in a critical dimension (CD) of a gate in a substrate and not to make a difference in semiconductor device parameters in the substrate by applying the nonuniform ion implantation method.

For instance, if the gate's CD in a central portion of the substrate is larger than that in edge portions of the substrate, the semiconductor device parameters have a higher threshold voltage ($V_T$) in the central portion than in the edge portions of the substrate. Thus, a difference in the threshold voltage ($V_T$), for example, the threshold voltage ($V_T$) of surface channel nMOSFETs, can be compensated by adjusting a local dose of implanted ions for the channel doping or threshold voltage adjust implantation in the central portion lower than that in the edge portions or by adjusting the local dose of implemented ions in the edge portions higher than that in the central portions through the nonuniform ion implantation method. On the other hand, if the gate's CD in the edge portions of the substrate is larger than that in the central portion of the substrate, the semiconductor device parameters have a higher threshold voltage ($V_T$) in the edge portions than that in the central portion. Thus, the difference in the threshold voltage ($V_T$), for example, the threshold voltage ($V_T$) of surface channel nMOSFETs, can be compensated by decreasing the dose of implanted ions in the edge portions than that in the central portion or by increasing the dose of implanted ions in the central portion through the nonuniform ion implantation method.

As mentioned above, a distribution of the gate's CD created by a process margin between the central and edge portions within the substrate can be compensated by applying the nonuniform ion implantation method. Accordingly, the distribution of the semiconductor device parameters is reduced, thereby increasing yields of products by decreasing failure due to the process margin.

Two nonuniform ion implantation methods use scanning in an X direction. A first method differentiates a scanning speed in the X direction according to locations of the substrate while performing the ion-implantation method, thereby creating a nonuniform dose distribution of implanted ions. A second method makes the nonuniform distribution of the dose of implanted ions using a rotation with a differentiating scanning speed in the X direction. The rotation can be performed by step-wise rotations more than one time between each X-direction beam scan or by the continuous rotation during the X-direction beam scan.

Figure 2:
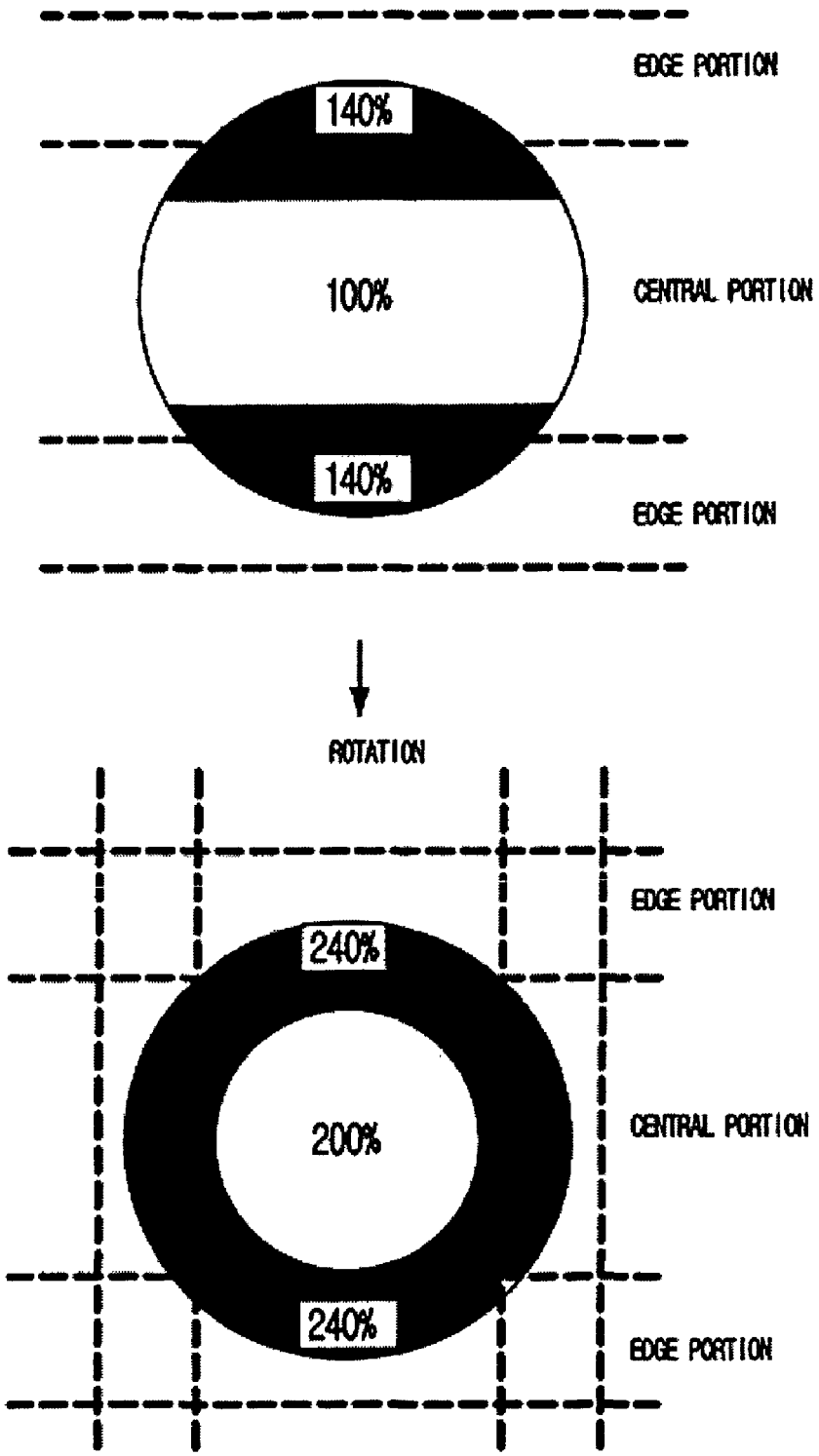
FIG. 2 is a diagram illustrating a case where a dose of implanted ions increases more in edge portions of a substrate than in a central portion of the substrate by scanning the ions in an X direction in accordance with a first embodiment of the present invention.

FIG. 2 is a diagram illustrating a case where a dose of implanted ions in edge portions of a substrate are increased more than in a central portion of the substrate by scanning the ions in an X direction in accordance with an aspect of the present invention.

Referring to FIG. 2, the dose of implanted ions in the edge portions of the substrate is increased more than that in the central portion by using scanning in the X direction to make an up and down symmetry based on a flat zone. For instance, if the dose of implanted ions in the central portion is approximately 100%, the dose of implanted ions in the edge portions is approximately 140%.

Next, if the ions are implanted by rotating the substrate, the dose of implanted ions in the edge portions increases more than that in the central portion of the substrate, thereby compensating the scatter diagram of the gate's CD. For instance, if the dose of implanted ions in the central portion is approximately 200%, the dose of implanted ions in the edge portions of the substrate is approximately 240% relatively, thereby compensating the scatter diagram of the gate's CD.

Figure 3:
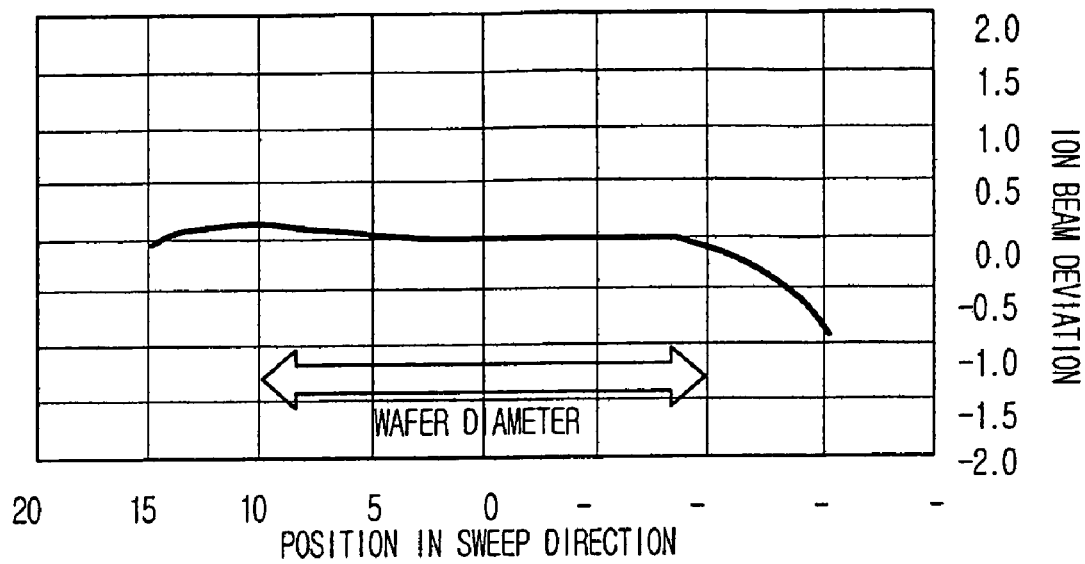
FIG. 3 is a diagram illustrating typical beam scan uniformity of a conventional uniform ion implantation method within a wafer diameter of 200 mm.

FIG. 3 is a scatter diagram showing beam scan uniformity of implanted ions across the beam scan direction in accordance with a conventional uniform ion implantation method.

Referring to FIG. 3, the beam current keeps nearly constant within the wafer diameter. Herein, the wafer diameter is 200 mm.

Figure 4:
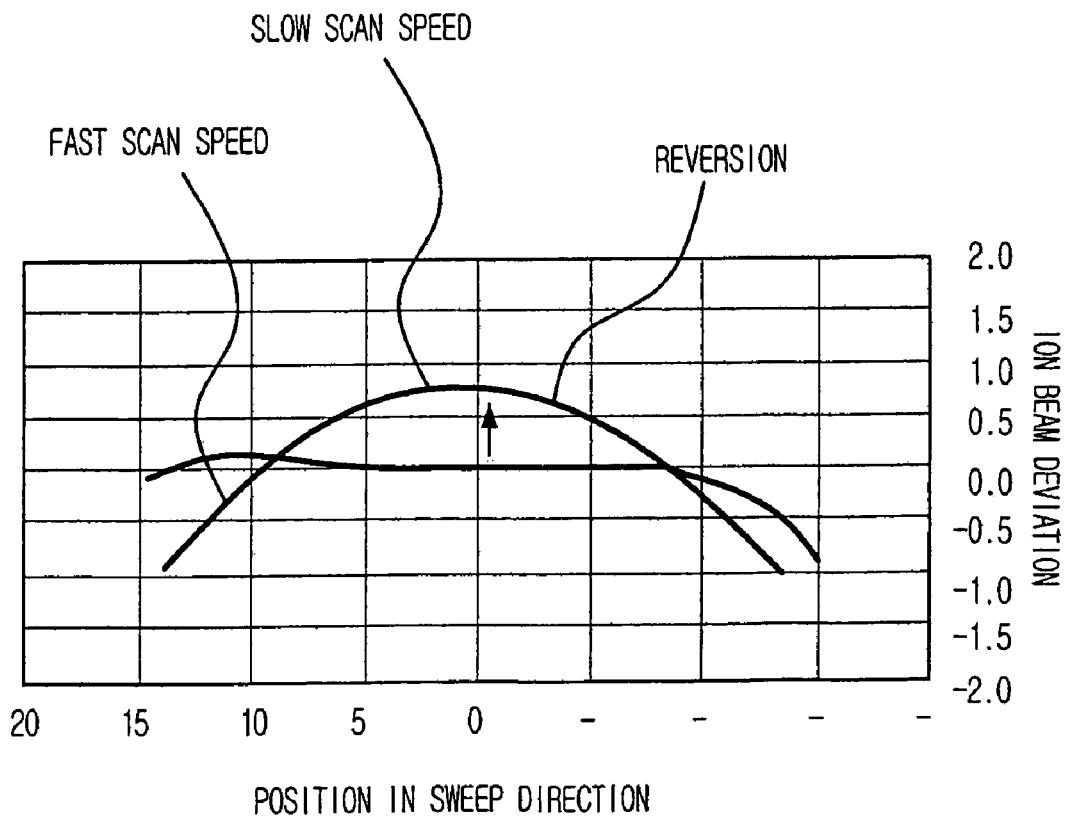
FIG. 4 is a scatter diagram showing a dose of implanted ions inside a substrate in accordance with the first embodiment of the present invention.

FIG. 4 is a scatter diagram showing a dose of implanted ions inside a substrate in accordance with an aspect of the present invention. In this case, the scatter diagram is reversed.

As for other methods using scanning in the X direction, there is a third method raising the distribution of the dose of implanted ions in the central portion higher than that in the edge portions and a fourth method that raises the distribution of the dose of implanted ions in the edge portions higher than that in the central portion.

In the case of the third and the fourth methods, the distribution of the dose of implanted ions in the substrate can be a circle-type distribution, a rectangular-type distribution, a left-right symmetric-type distribution or an up-and-down symmetric-type distribution.

Next, in contrast to scanning in the X direction, the nonuniform ion implantation method can be applied by scanning in a Y direction to improve the distribution of the semiconductor device parameters in the substrate.

For instance, in case of performing the nonuniform ion implantation method, there are two nonuniform ion implantation methods by using scanning in the Y direction. A first method differentiates a scanning speed in the Y direction according to locations of the substrate while performing the ion-implantation method, thereby making a nonuniform distribution of the dose of implanted ions. A second method makes the nonuniform distribution of the dose of implanted ions using a rotation that differentiates the scanning speed in the Y direction. The rotation can be performed by step-wise rotation more than one time between each Y-direction beam scan or by the continuous rotation during the Y-direction beam scan.

As for other methods using the scanning in the Y direction, there is a third method raising the distribution of the dose of implanted ions in the central portion higher than that in the edge portions and a fourth method that raises the distribution of the dose of implanted ions in the edge portions higher than that in the central portion.

In case of the third and the fourth methods, the distribution of the dose of implanted ions in the substrate can be a circle-type distribution, a rectangular-type distribution, a left-right symmetric-type distribution or an up-and-down symmetric type distribution.

As illustrated above, the ions are nonuniformly implanted by differentiating the scanning speeds according to the locations of the substrate while scanning in the X and the Y directions. At this time, the scanning speeds have an inverse relationship to the dose of implanted ions.

For instance, when using a scanning method in the X direction, the scanning speed in the central portion should be faster than that in the edge portions to raise the dose of implanted ions in the edge portions of the substrate.

Conversely, the scanning speed in the edge portions of the substrate should be faster than that in the central portion to raise the dose of implanted ions in the central portion of the substrate.

As explained above, even though the dose of implanted ions is differently set according to the locations of the substrate, the threshold voltage $V_T$ created by the ion implantation is uniformly formed on the whole substrate.

Finally, to improve distribution of the semiconductor device parameters in the substrate, the scanning method in the X direction and the scanning method in the Y direction can be simultaneously applied to the embodiments of the present invention.

For instance, in case of applying the nonuniform ion implantation method by simultaneously using scanning methods in the X and Y directions, there are two methods to be applied. A first method simultaneously differentiates the scanning speeds in the X and Y directions according to the locations of the substrate during performance of the ion-implantation method, thereby causing a nonuniform distribution of the dose of implanted ions. A second method causes the nonuniform distribution of the dose of implanted ions when using a rotation while differentiating the scanning speeds in the X and Y directions.

Furthermore, as for other methods simultaneously using the scanning methods in the X and Y directions, a third method increases distribution of the dose of implanted ions in the central portion over that in the edge portions, and a fourth method increases the distribution of the dose of implanted ions in the edge portions over that in the central portion.

In applying the third and the fourth methods, the distribution of the dose of implanted ions in the substrate can be a circle-type distribution, a rectangular-type distribution, a left-right symmetric-type distribution or an up-and-down symmetric type distribution.

The present invention can nonuniformly form an ion-implantation screen layer applied to the ion-implantation method in addition to the nonuniform ion implantation method by using the scanning method in an X direction or in a Y direction.

That is, the ion-implantation screen layer can be made by stacking an oxide layer or a nitride layer. In addition, the ion-implantation screen layer can be formed by using a combination thereof.

Furthermore, the distribution of the dose in the nonuniform ion implantation method can be applied as a structure-dependent conception.

Figure 5:
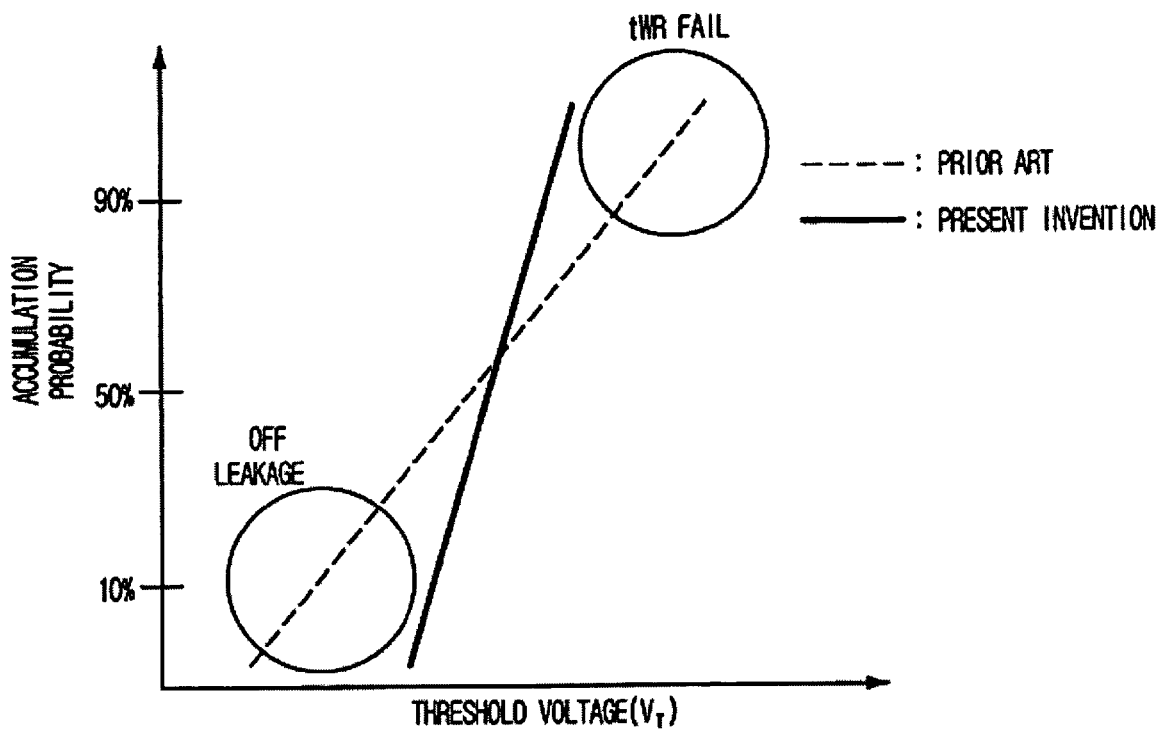
FIG. 5 is a diagram showing a comparison between a distribution of a threshold voltage in accordance with an embodiment of the present invention and a threshold voltage of the conventional method.

FIG. 5 is a diagram showing a comparison between a distribution of a threshold voltage in accordance with an aspect of the present invention and a distribution of a threshold voltage in accordance with the conventional method.

Referring to FIG. 5, the conventional method generates an off leakage fail, having a distribution of a low threshold voltage ($V_T$) and also generates a tWR fail, especially in DRAM, having a distribution of a high threshold voltage ($V_T$).

However, the present invention improves the distribution of the threshold voltage ($V_T$), thereby compensating a difference in the threshold voltage ($V_T$) caused by the distribution of the gate's CD between the edge portions and the central portion of the substrate. Therefore, the present invention prevents the off leakage fail and the tWR fail generated by the conventional method.

The present invention provides an effect of making uniform semiconductor parameters in a central portion and edge portions of a substrate by using a nonuniform ion implantation method. Furthermore, in case of using the present invention, there is an effect of improving a margin fail of approximately more than 10%.

The aspect of the present invention described hereinafter recognizes the distribution of the gate's CD and a distribution of the width of spacers formed on gate sidewalls and tries to improve the distribution of the transistor parameters in the substrate by forming nonuniform junction profiles according to the locations of the substrate through a local source/drain ion-implantation method when the junction is formed.

Figure 6:
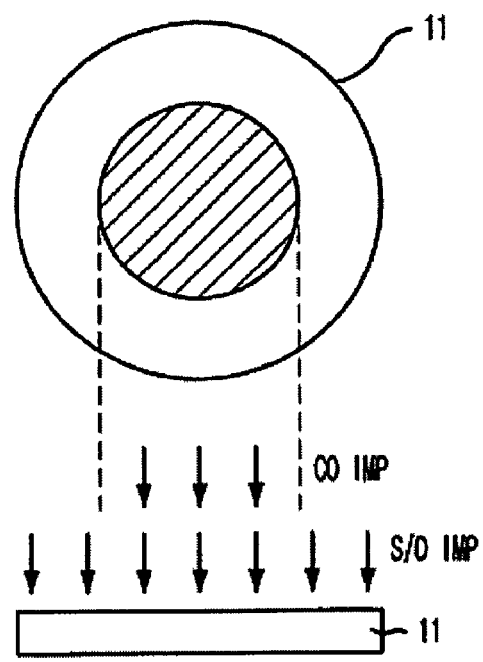
FIGS. 6 and 7 are diagrams illustrating an ion-implantation method of a semiconductor device in accordance with a second embodiment of the present invention.
Figure 7:
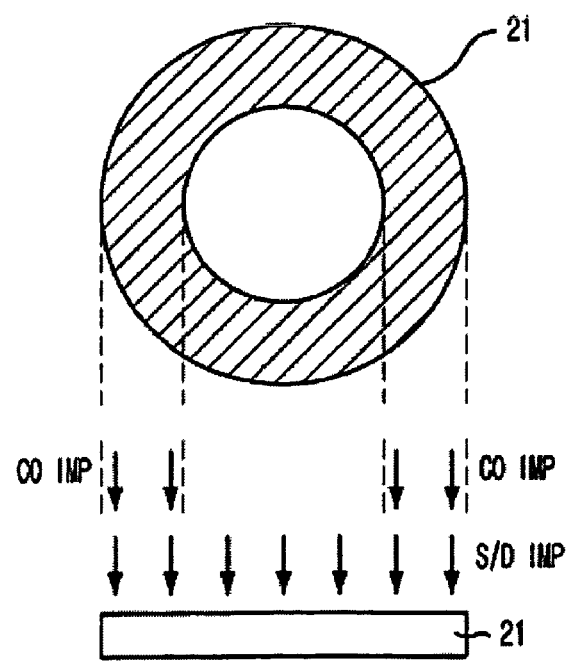

FIGS. 6 and 7 are diagrams illustrating an ion-implantation method of a semiconductor device in accordance with a second embodiment of the present invention.

Referring to FIGS. 6 and 7, an ion-implantation method for forming a source/drain junction is performed on a substrate 11.

After completing the ion implantation for forming the source/drain junction, the transistor parameters can be scattered according to the locations of the substrate by processes for forming the gate and the spacer already performed.

Accordingly, the present invention additionally employs a local compensation ion-implantation (CO IMP) process for controlling the distribution of the transistor parameters according to the locations of the substrate, thereby minimizing a difference in the transistor parameters caused by the different locations of the substrate. Herein, the compensation ion-implantation (CO IMP) process means to complement an $N^-/N^+$-type junction or a $P^+$-type junction.

For instance, referring to FIG. 6, the compensation ion-implantation (CO IMP) process is additionally performed at a central portion of substrate 11 finished with the source/drain ion-implantation (S/D IMP). Also, referring to FIG. 7, the compensation ion-implantation (CO IMP) process is additionally performed to edge portions of substrate 21 finished with a source/drain ion-implantation (S/D IMP).

As shown above, the compensation ion-implantation (CO IMP) process locally and additionally performed is applied to each of the substrates 11 and 21 after performing the source/drain ion-implantation (S/D IMP) for forming the $N^-$-type junction formed in a cell region of a dynamic random access memory (DRAM), the $P^+$-type junction formed in a metal-oxide-semiconductor field effect transistor with a P-type channel (PMOSFET) of a peripheral region and the $N^+$-type junction formed in a metal-oxide-semiconductor field effect transistor with an N-type channel (NMOSFET) of the peripheral region.

First, in case of locally and additionally performing the compensation ion-implantation (CO IMP) to a junction where the difference in the transistor parameters is generated, i.e., the central portion or the edge portions of the substrate, in the $N^-$-type junction formed in the cell region or the $N^+$-type junction formed in the peripheral region, the ion-implantation is performed either by leaving a mask introduced for forming the $N^-$ or $N^+$-type junction or by using a separate mask additionally brought. At this time, $^{31}P$ or $^{75}As$ is used as the impurity.

During additionally performing the ion implantation after a formation of the N or $N^+$-type junction, a tilt and a rotation are used. Moreover, a multimode more than a bi-mode is used. Herein, the bi-mode is one of the ion-implantation methods. For instance, the bi-mode means to implant half of the dose of implanted ions at a 7° tilted angle and the other half at −7° tilted angle.

In the $P^+$-type junction formed in the peripheral region, in case of locally and additionally performing the compensation ion-implantation (CO IMP) at the junction generating the difference in transistor parameters, i.e., the central portion or the edge portions of the substrate, the ion implantation is performed by using the same mask introduced for forming the $P^+$-type junction or by using a separate mask.

The impurities used for the compensation ion-implantation (CO IMP) locally and additionally performed in the $P^+$-type junction are $^{11}B$, $^{49}BF_2$ and $^{30}BF$. The compensation ion-implantation (CO IMP) is performed by using a tilt and a rotation. In addition, a multimode more than a bi-mode is used for the compensation ion-implantation (CO IMP) locally and additionally performed in the $P^+$-type junction.

As explained above, the compensation ion-implantation (CO IMP) locally and additionally performed is employed by controlling a scanning region of the ion implantation.

Figure 8:
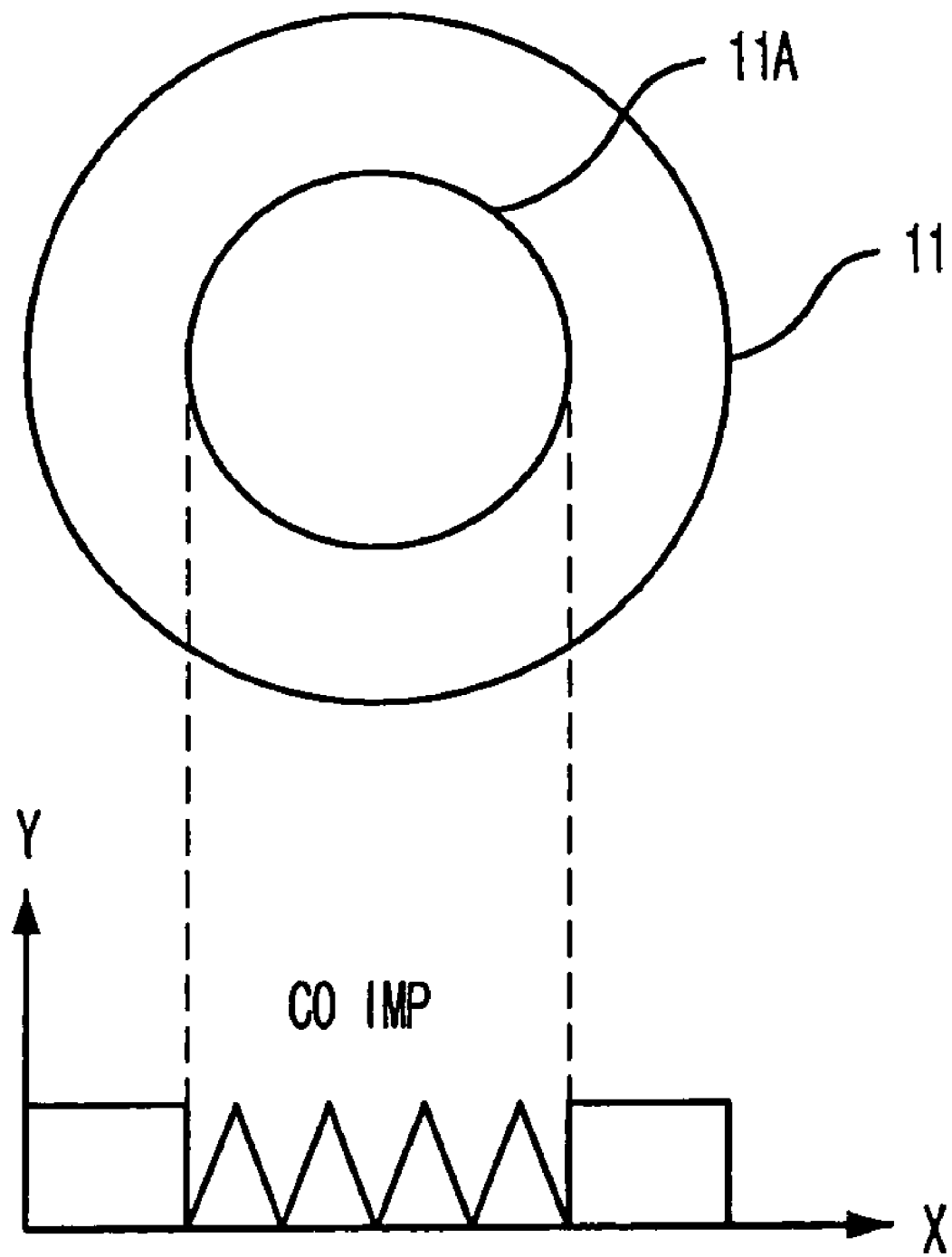
FIG. 8 is a diagram illustrating an ion-implantation method implemented through controlling a scanning region shown in FIG. 6 in accordance with a second embodiment of the present invention.

FIG. 8 is a diagram illustrating an ion-implantation method through controlling a scanning region shown in FIG. 6 in accordance with the present invention.

Referring to FIG. 8, scanning regions 11A in X and Y directions are set with respect to substrate 11 for the compensation ion-implantation (CO IMP) locally and additionally performed. Afterwards, an X/Y-decoder is set and then, the ion implantation is selectively performed to a region subjected to the ion implantation locally performed. At this time, the ion implantation locally performed is employed by controlling a scanning speed in the X or Y direction, or both of the scanning speeds in the X and Y directions. Furthermore, the ion-implantation locally performed can be employed by differentiating a ratio of the dose of implanted ions with respect to the X and Y directions.

Table 1 shows a comparison between the conventional ion-implantation method and the ion-implantation method in accordance with the present invention.

TABLE 1

|  | Conventional method | Present method |
|---|---|---|
| Mask | Yes | Yes |
| S/D IMP | $N^-$, $N^+$, $P^+$ | $N^-$, $N^+$, $P^+$ |
| CO IMP | No | Yes |
| PR Strip | Yes | Yes |

As shown in Table 1, the present invention employs the compensation ion implantation (CO IMP) locally and additionally performed after the source/drain ion implantation (S/D IMP). Through the compensation ion-implantation (CO IMP) locally and additionally performed, it is possible to minimize the difference in the transistor parameters according to the locations of the substrate.

The present invention locally and additionally performs an ion implantation after forming a junction, thereby making it possible to control a variation caused by a distribution of a critical dimension (CD) of a gate, a process for depositing spacers on sidewalls of the gate and an etching process. In addition, this nonuniform ion implantation method can be applied to implant ions on channel regions, source/drain regions, lightly doped drain regions or source drain extension regions of MOSFETs with locally different doses into a semiconductive substrate by nonuniform ion implantation for the purpose of reducing the variation of device characteristics including a threshold voltage of semiconductive MOSFET devices. Furthermore, the present invention provides an effect of minimizing a difference in transistor parameters according to locations of a substrate, thereby increasing yields of products due to a margin.

The present application contains subject matter related to the Korean patent application Nos. KR 2004-0032799 and 2004-0077964, filed in the Korean Patent Office on May 10, 2004, and Sep. 30, 2004, the entire contents of which are incorporated herein by reference.

Although the present invention has been described with respect to certain preferred embodiments, it will be apparent to those skilled in the art that various changes and modifications may be made without departing from the spirit and scope of the invention as—defined in the following claims.

What is claimed is:

1. A method for implanting ions with locally different doses into a substrate by nonuniform ion implantation, the method comprising:
providing the substrate on a holder; and
scanning ion beams in X and Y directions wherein the Y direction is substantially perpendicular to the X direction with respect to the substrate to implant the ions into the substrate nonuniformly so as to obtain different doses of implanted ions in different portions of the substrate by simultaneously differentiating scanning speeds in the X and Y directions,
wherein the ion beams are scanned in the X and Y directions without moving the substrate, and the ions are implanted non-linearly on the substrate without moving the substrate.

2. The method of claim 1, wherein the ions are implanted non-linearly on the substrate by controlling only the scanning direction.

3. A method for implanting ions with locally different doses into a semiconductive substrate by nonuniform ion implantation, the method comprising:
providing the substrate on a holder; and
scanning ion beams in X and Y directions with respect to the substrate wherein the Y direction is substantially perpendicular to the X direction to implant the ions into the substrate nonuniformly so as to obtain different doses of implanted ions in different portions of the substrate by simultaneously differentiating scanning speeds in the X and Y directions,
wherein the substrate provided with the nonuniform ion implantation is configured to reduce the variation of a device characteristic of a semiconductor device that is fabricated using the substrate, and
wherein the ion beams are scanned in the X and Y directions without moving the substrate, and the ions are implanted non-linearly on the substrate without moving the substrate.

4. The method of claim 3, wherein the ions are implanted non-linearly on the substrate by controlling only the scanning direction.

5. A method for implanting ions into a substrate by scanning ion beams in in an X direction and in a Y direction substantially perpendicular to the X direction with respect to the substrate, the method comprising:
nonuniformly implanting a dose of implanted ions in a central portion and edge portions of the substrate by simultaneously differentiating a scanning speed in the X direction and a scanning speed in the Y direction in the central portion and the edge portions so as to obtain a different dose of implanted ions in the edge portions than in the central portion,
wherein the ion beams are scanned in the X and Y directions without moving the substrate, and the ions are implanted non-linearly on the substrate without moving the substrate.

6. The method of claim 5, wherein the dose of implanted ions in the central portion is raised and the dose of implanted ions in the edge portions is lowered.

7. The method of claim 5, wherein the dose of implanted ions in the central portion is lowered and the dose of implanted ions in the edge portions is raised.

8. The method of claim 6, wherein a distribution of the dose of implanted ions includes one of a circle type distribution, a rectangular type distribution, a left and right symmetric type distribution and an up and down symmetric type distribution.

9. The method of claim 7, wherein a distribution of the dose of implanted ions includes one of a circle type distribution, a rectangular type distribution, a left and right symmetric type distribution and an up and down symmetric type distribution.

* * * * *